（12） United States Patent
Konstantinov

(10) Patent No.: US 12,107,173 B2
(45) Date of Patent: *Oct. 1, 2024

(54) SCHOTTKY RECTIFIER WITH SURGE-CURRENT RUGGEDNESS

(71) Applicant: SEMICONDUCTOR COMPONENTS INDUSTRIES, LLC, Scottsdale, AZ (US)

(72) Inventor: Andrei Konstantinov, Sollentuna (SE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 18/322,249

(22) Filed: May 23, 2023

(65) Prior Publication Data
US 2023/0411536 A1  Dec. 21, 2023

Related U.S. Application Data

(63) Continuation of application No. 17/450,734, filed on Oct. 13, 2021, now Pat. No. 11,715,804, which is a
(Continued)

(51) Int. Cl.
*H01L 29/872* (2006.01)
*H01L 21/04* (2006.01)
(Continued)

(52) U.S. Cl.
CPC .......... *H01L 29/872* (2013.01); *H01L 21/046* (2013.01); *H01L 21/0465* (2013.01);
(Continued)

(58) Field of Classification Search
CPC . H01L 29/872; H01L 21/046; H01L 21/0465; H01L 32/047; H01L 21/761; H01L 29/0619; H01L 29/0623; H01L 29/0634; H01L 29/1608; H01L 29/36; H01L 29/6606; H01L 29/045
See application file for complete search history.

(56) References Cited

U.S. PATENT DOCUMENTS 7,728,402 B2   6/2010   Zhang et al.
7,728,403 B2   6/2010   Harris et al.
(Continued)

FOREIGN PATENT DOCUMENTS

DE    19820734 A1    11/1999
JP    2017168663 A    9/2017
(Continued)

OTHER PUBLICATIONS

International Search Report and Written Opinion for Application No. PCT/US2019/068946, mailed on Apr. 6, 2020, 12 pages.
(Continued)

*Primary Examiner* — Earl N Taylor
(74) *Attorney, Agent, or Firm* — Brake Hughes Bellermann LLP

(57) ABSTRACT

A SiC Schottky rectifier with surge current ruggedness is described. The Schottky rectifier includes one or more multi-layer bodies that provide multiple types of surge current protection.

16 Claims, 14 Drawing Sheets

Related U.S. Application Data continuation of application No. 16/512,780, filed on Jul. 16, 2019, now Pat. No. 11,171,248.

(60) Provisional application No. 62/804,559, filed on Feb. 12, 2019.

(51) Int. Cl.

| | |
|---|---|
| H01L 21/761 | (2006.01) |
| H01L 29/04 | (2006.01) |
| H01L 29/06 | (2006.01) |
| H01L 29/16 | (2006.01) |
| H01L 29/36 | (2006.01) |
| H01L 29/66 | (2006.01) |

(52) U.S. Cl.
CPC .......... *H01L 21/047* (2013.01); *H01L 21/761* (2013.01); *H01L 29/0619* (2013.01); *H01L 29/0623* (2013.01); *H01L 29/0634* (2013.01); *H01L 29/1608* (2013.01); *H01L 29/36* (2013.01); *H01L 29/6606* (2013.01); *H01L 29/045* (2013.01)

(56) References Cited

U.S. PATENT DOCUMENTS

| | | | |
|---|---|---|---|
| 9,368,650 B1* | 6/2016 | Yen | H01L 29/0688 |
| 9,577,046 B1 | 2/2017 | Hori et al. | |
| 9,929,284 B1 | 3/2018 | Zhang et al. | |
| 10,566,464 B2* | 2/2020 | Oota | H01L 29/0688 |
| 11,171,248 B2* | 11/2021 | Konstantinov | H01L 29/36 |
| 2010/0032791 A1 | 2/2010 | Hozumi et al. | |
| 2010/0096692 A1* | 4/2010 | Saito | H01L 29/7813 |
| | | | 257/330 |
| 2011/0175106 A1* | 7/2011 | Mizukami | H01L 29/0692 |
| | | | 257/77 |
| 2012/0098064 A1* | 4/2012 | Onishi | H01L 29/0619 |
| | | | 257/341 |
| 2014/0231867 A1* | 8/2014 | Yamashita | H01L 29/7813 |
| | | | 257/140 |
| 2015/0048384 A1* | 2/2015 | Tanaka | H01L 29/6606 |
| | | | 257/77 |
| 2015/0287778 A1 | 10/2015 | Tamaki et al. | |
| 2016/0190126 A1* | 6/2016 | Bauer | H01L 29/0688 |
| | | | 257/476 |
| 2016/0233295 A1 | 8/2016 | Schultze et al. | |
| 2016/0315203 A1* | 10/2016 | Uchida | H01L 29/045 |
| 2017/0154984 A1 | 6/2017 | Eguchi et al. | |
| 2017/0271528 A1* | 9/2017 | Oota | H01L 29/872 |
| 2017/0345891 A1 | 11/2017 | Van Brunt et al. | |
| 2018/0069083 A1 | 3/2018 | Suvorov et al. | |
| 2019/0259842 A1* | 8/2019 | Basler | H01L 29/7805 |
| 2020/0006496 A1* | 1/2020 | Bauer | H01L 29/6606 |
| 2020/0259022 A1* | 8/2020 | Konstantinov | H01L 21/046 |
| 2022/0131016 A1* | 4/2022 | Konstantinov | H01L 29/0611 |

FOREIGN PATENT DOCUMENTS

| | | |
|---|---|---|
| WO | 2012037936 A1 | 3/2012 |
| WO | 2012149195 A1 | 11/2012 |

OTHER PUBLICATIONS

Persson, C. et al "Band gap narrowing in n-type and p-type 3C—, 2H—, 4H—, 6H—SiC, and Si", Journal of Applied Physics vol. 86, No. 8 Oct. 15, 1999, pp. 4419-4427.

Kosugi, R. et al, "First experimental demonstration of SiC super-junction (SJ) structure by multi-epitaxial growth method", Proceedings of the 26th International Symposium on Power Semiconductor Devices & IC's, 2014 IEEE, pp. 346-349.

M. Janson, M. et al., "Channeled Implants in 6H Silicon Carbide," Mat. Science Forum, vols. 338-342 (2000), pp. 889-892.

Office Action dated Mar. 31, 2023 for counterpart European Patent Application No. 19848918.9, 6 pages.

First Office Action for Chinese Application No. 201980094692.1, mailed Aug. 15, 2024, 13 pages (English translation).

* cited by examiner

SCHOTTKY RECTIFIER WITH SURGE-CURRENT RUGGEDNESS

RELATED APPLICATIONS

This application is a continuation application of U.S. patent application Ser. No. 17/450,734, filed Oct. 13, 2021, which is a continuation application of U.S. patent application Ser. No. 16/512,780, filed Jul. 16, 2019, which claims priority to and the benefit of U.S. Provisional Application No. 62/804,559, filed Feb. 12, 2019, these applications are incorporated by reference herein in their entireties.

TECHNICAL FIELD

This description relates to Schottky rectifier semiconductor devices.

BACKGROUND

Silicon carbide (SiC) devices, and, in particular, silicon carbide high power devices, provide advantages such as high switching speed and low power losses. Examples of highly-efficient SiC power devices include (but are not limited to) rectifiers, field-effect transistors (FETs) and bipolar Junction Transistors (BJTs).

Schottky rectifiers are types of diodes with a metal-semiconductor junction. Schottky rectifiers are known to have a low forward voltage drop, and fast switching speeds. SiC Schottky rectifiers thus provide the advantages of SiC devices in general, as well as the advantages of conventional (e.g., silicon-based) Schottky rectifiers.

Schottky rectifiers, including SiC Schottky rectifiers, are often used in, e.g., power conversion systems. In these and other settings, high current surges may be problematic. For example, in power conversion systems, high surge current may be caused by short-circuit conditions at a load. Rectifier current can not be interrupted during a surge current event, and therefore rectifiers should be able to survive a surge-current event without failure. Thus, Schottky rectifiers are often subjected to various reliability or ruggedness requirements related to immunity from forward current surge.

Existing techniques are used to improve surge current reliability and ruggedness for Schottky rectifiers. For example, it is possible to include a merged p-n diode with a Schottky rectifier (which may be referred to as a "MPS," or junction-blocked (JBS) rectifier). Such MPS/JBS devices may be further improved with respect to withstanding surge current events, e.g., by adding relatively wide p-bodies that serve to increase the forward voltage drop of the Schottky rectifier at some locations of the rectifier during surge current events. However, such existing approaches either do not achieve desired levels of surge current reliability or ruggedness, or suffer from other shortcomings, such as consuming excessive device area.

SUMMARY

In the following disclosure, example implementations of a Schottky rectifier are described that provide surge current protection, against multiple types of surge current events. For example, one type of surge current event is relatively short, while a second type may be relatively longer (where length of the surge current event may be defined, e.g., in terms of units of time or units of a relevant line cycle). Different current magnitudes and characteristics may be associated with the different types of surge current events. The described Schottky rectifier structures provide surge current protection in multiple types of surge current scenarios, while minimizing or reducing situations in which solution techniques in one context undesirably mitigate effects of solution techniques in another context.

According to one general aspect, a Schottky rectifier device includes a Silicon Carbide (SiC) layer, a channel region of a first conductivity type formed on the SiC layer, and a metal contact formed on the channel region. The Schottky rectifier device further includes a multi-layer body of a second conductivity type formed within the channel region and extending from the metal contact in a direction of the SiC layer, the multi-layer body including a first layer adjacent to the metal contact and having a first doping concentration, a second layer adjacent to the first layer and having a second doping concentration less than the first doping concentration, and a third layer adjacent to the second layer and having a third doping concentration less than the second doping concentration.

According to another general aspect, a method of making a Schottky rectifier device includes forming a Silicon Carbide (SiC) substrate, forming an epitaxial layer of a first conductivity type on the SiC substrate. The method includes forming a masking layer on the epitaxial layer, performing ion implantation of donors of a second conductivity type through the masking layer, to thereby form a portion of a charge-balancing body, and removing the masking layer. The method further includes repeating the forming of the epitaxial layer and the masked ion implantation until the charge-balancing body reaches a specified thickness, forming an injection layer on the charge-balancing body, the injection layer having a doping concentration of the second conductivity type that is higher than a doping concentration of the charge-balancing body, forming a contact layer on the injection layer; and forming a metal contact over the contact layer and the epitaxial layer.

According to another general aspect, a Schottky rectifier device includes a Silicon Carbide (SiC) layer, a channel region of a first conductivity type formed on the SiC layer, and a metal contact formed on the channel region. The Schottky rectifier device includes a multi-layer body of a second conductivity type formed within the channel region and extending from the metal contact in a direction of the SiC layer, the multi-layer body including a tunnel contact layer adjacent to the metal contact, an injection layer adjacent to the first layer, and a deep layer adjacent to the second layer, wherein the multi-layer body extends at least thirty percent of a distance between the metal contact and the SiC layer.

The details of one or more implementations are set forth in the accompanying drawings and the description below. Other features will be apparent from the description and drawings, and from the claims.

DETAILED DESCRIPTION

Figure 1:
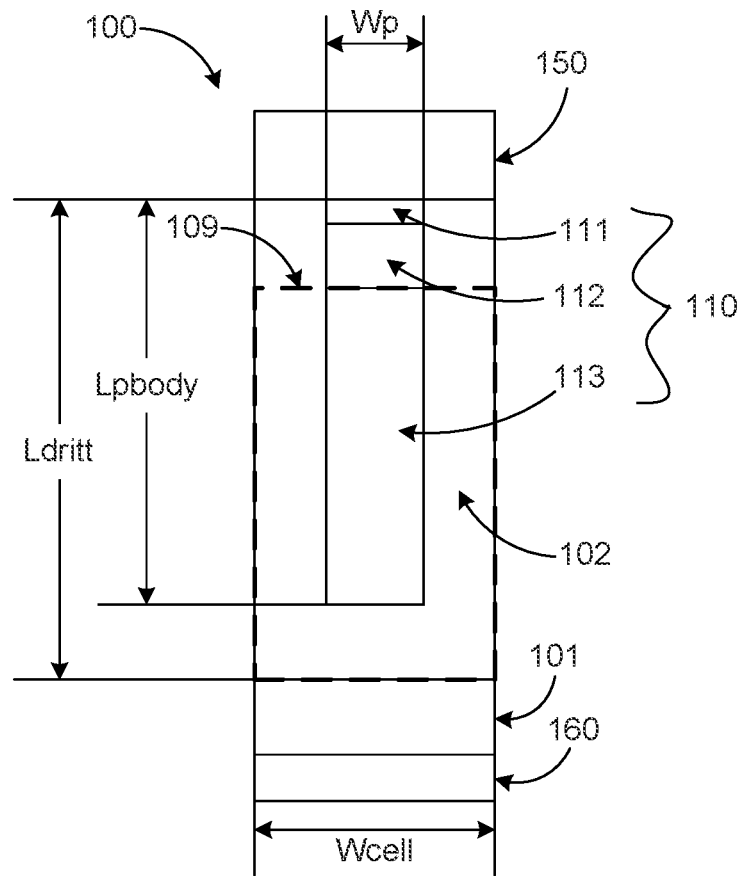
FIG. 1 is a schematic cross-section of a SiC Schottky rectifier with surge current ruggedness.

FIG. 1 is a schematic cross-section of a SiC Schottky rectifier 100 with surge current ruggedness. As referenced above, the Schottky rectifier 100 may be configured to provide multiple types of surge current protection. For example, for reference in the following description, a typical time for a maximum surge current $I_{FM}$, which may be due to load short-circuiting, is, e.g., approximately 10 μs, and similar measurement times may be used for testing $I_{FM}$ (with 10 μs being a common standard). Another surge-current ruggedness requirement is the capacity to maintain a single-pulse maximum surge current, $I_{FSM}$, e.g., for half period of the line cycle, which for typical power applications may be approximately 10 ms. As described herein, the SiC Schottky rectifier 100 provides surge current ruggedness for both $I_{FM}$ and $I_{FSM}$ surge current events.

In FIG. 1, the SiC Schottky rectifier 100 is illustrated as including an n-type channel region 102 parallel to a multi-layer p-body 110, which includes layers 111, 112, 113 in the example of FIG. 1. As described in more detail, below, the multi-layer p-body 110 provides surge current ruggedness with respect to the n-type channel 102 during surge current events. For example, the multi-layer p-body 110 may include an injection layer 112 that is constructed and doped so as to provide high injection efficiency. The multi-layer p-body 110 may include a deep p-body 113 that extends in parallel to the n-type channel, and may, in some implementations, extend entirely along a remainder of a length of the n-type channel 102 to contact a substrate 101 of the Schottky rectifier.

The multi-layer p-body 110 may provide surge current protection during relatively long surge current events (e.g., $I_{FSM}$) by, e.g., causing an electron current flow along the n-type Schottky channel 102, which generates a sufficiently high voltage drop to cause turn-on of the p-n diode formed by the multi-layer p-body 110 and the n-type channel 102. More particularly, the structure of the multi-layer p-body 110 decreases the voltage needed for the turn-on of minority carrier injection at the p-n diode, as compared to conventional MPS/JBS Schottky rectifiers.

For example, in conventional MPS/JBS Schottky rectifiers, a 10-ms surge-current event may have a requirement of withstanding a current surge up to 4× to 10× the rated current of the MPS/JBS Schottky rectifier. However, during a transition from normal current levels to surge current levels, short circuiting of the p-n diodes by vertical Schottky rectifier channels may occur as a result of the relatively lower turn-on voltage of the Schottky rectifier (around 1V) as compared to that of the neighbor p-n diode (around 3V). This shorting effect prevents the turn-on of the injection mode of the p-n diode at reasonably low forward bias, and reduces the surge current ruggedness of such conventional MPS/JBS Schottky rectifiers.

In contrast, the multi-layer p-body 110 includes a number of characteristics and features that are advantageous over conventional MPS/JBS Schottky rectifiers. For example, the injection layer 112 is constructed to provide a high injection efficiency, and, together with the relative length of the deep p-body 113, causes the multi-layer p-body 110 to provide a superjunction effect for charge balancing of the n channel 102, where such charge balancing occurs during reverse-bias conditions. During a forward-bias surge current event, such as a relatively long surge current event (e.g., $I_{FSM}$), a forward voltage drop of the p-n diode 110/102 is lowered, relative to the turn-on voltage of the Schottky rectifier 100, which mitigates or eliminates the undesired short circuit effect of the vertical Schottky channel 102 on the p-n diode 110/102.

Further, the multi-layer p-body 110 may include a tunnel contact layer 111, e.g., in contact with the injection layer 112. Thus, as shown, the injection layer 112 links the tunnel contact layer 111 and the deep p-body layer 113.

The tunnel contact layer 111 provides a reduced voltage drop during relatively short surge current events (e.g., $I_{FM}$). In other words, the tunnel contact layer 111 provides surge current ruggedness for scenarios with short current pulses having high current densities.

In implementations in which the injection layer 112 links the tunnel contact layer 111 and the deep p-body layer 113, the injection layer 112 may be doped and otherwise configured, as described below, to prevent recombination of electrons at the tunnel contact layer 111. Such recombination, if not prevented, may mitigate, or be detrimental to, surge current ruggedness during scenarios with relatively longer surge current events (e.g., $I_{FSM}$).

Charge balancing may occur within a charge-balanced region schematically illustrated as region 109 in FIG. 1. Charge balance is generally not achieved in areas below or above the region 109, because either acceptor or donor concentrations outside the region 109 are very high.)

In FIG. 1, the Schottky rectifier 100 is formed using a n-doped epitaxial layer, which layer forms a drift region 102 on top of the n+ substrate 101. The multi-layer p-bodies (represented by the multi-layer p-body 110) penetrate in depth by Lpbody, which is between, e.g., approximately 30% and 100% of the drift region thickness Ldrift. The multi-layer p-body 110 has a width of Wp, as shown. The unit cell has a period of Wcell, which number should preferably be smaller than the drift region length, i.e., Wcell<Ldrift.

The unit cell of FIG. 1 may be provided with a metal layer 150, which forms a Schottky contact with desired barrier height to the n-region 102. An Ohmic contact 160 is provided at the bottom of the n+ substrate 101.

With respect to doping, in some example implementations, the tunnel contact layer 111 may be provided degenerate acceptor doping to a concentration of, e.g., $10^{20}$ cm$^{-3}$ or higher. That is, as referenced above, the heavily-doped p-body portion (tunnel contact layer) 111 provides a tunnel contact to the top metal 150, which prevents excessive voltage drop at the interface of the metal 150 to the layer 111 at very high current densities, which correspond to the mode of IFM test. A near-surface acceptor concentration of higher than approximately $10^{20}$ cm$^{-3}$ may be used to insure low forward drop at the metal contact 150 to the multi-layer p-body 110 at the tunnel contact layer 111.

In more detailed examples, mean current density through an active area of a 650V Schottky rectifier may approach 40 kA/cm² under conditions corresponding to the IFM test. Local current density through the multi-layer p-body 110 may be, e.g., two times the mean value, e.g., 80000 A/cm² during the 10-microsecond surge current event. A good quality Ohmic contact to p-type SiC has a specific resistance of around $10^{-5}$ to $3\times10^{-5}$ Ohm cm² for an optimized metallization scheme. With a current density of around 100 kA/cm², the contact resistance may result in a parasitic voltage drop in the p-type body 110 of well over 1 Volt. However, in many cases the Ohmic contact process is simplified for manufacturing considerations, and the specific resistance of such a simplified contact may be $10^{-4}$ Ohm cm² or higher. High near-surface acceptor concentration of above $1\times10^{20}$/cm³ will facilitate direct tunneling at the contact-to-semiconductor interface 150/111, and will prevent formation of excessively high voltage drop at this interface.

In example implementations, the injection layer 112 is provided an acceptor dose of above approximately $2\times10^{14}$ cm⁻², with an acceptor doping of below approximately $2\times10^{19}$ cm⁻³. As explained below, a lower level of about $1\times10^{18}$ cm⁻³ may be maintained in example implementations, to ensure acceptable levels of injection efficiency.

The multi-layer p-body 110 penetrates, in example implementations, to at least 30% of the drift region 102 towards the substrate 101. In example implementations, the ratio of Lpbody to Ldrift may be between 0.7 and 0.9. Acceptor doping of the deep p-body 113 may be between approximately $2\times10^{16}$ cm⁻³ and $1\times10^{18}$ cm⁻³ In some example implementations, acceptor dose in the deep p-body 113 is selected so as to provide its depletion to at least 50% of its length at reverse bias, before the point of avalanche breakdown.

As referenced above, in example implementations, the injection layer 112 may be designed and configured to provide a high injection efficiency. Specifically, the injection layer 112 may be designed to have a high effective Gummel number.

In this regard, a regular Gummel number may be understood to represent an integral of doping concentration over layer thickness (e.g., carrier path length). The Gummel number is indicative of an injection efficiency of a doped layer, and may provide a good approximation of such injection efficiency in some scenarios, particularly for relatively lower doping levels.

However, as doping levels increase, an effect indicated by the Gummel number is reduced from levels that would be expected based on the actual dosing concentration(s). Specifically, as doping levels increase for a given path length, various physical effects contribute to such reductions, and, in particular, bandgap narrowing that is known to occur in heavily-doped regions due to many-body quantum effects may promote injection of minority carriers into heavily-doped materials, while suppressing carrier injection out of the heavily-doped materials.

The resulting effective Gummel number "$NG_{eff}$" for a p-type layer with a box acceptor profile is $NG_{eff}=Q_a*\exp(-dEg/kT)$, where $Q_a$ is the dose of ionized acceptors, dEg the bandgap lowering due to heavy doping, k is the Boltzmann constant and T is the Kelvin temperature. Taking such bandgap narrowing into account, the top limit for doping of the injection layer 112 may be, in example implementations, set to approximately $2\times10^{19}$ cm⁻³. In example implementations, lower doping may be preferred in order to optimize injection efficiency, because significant bandgap narrowing is known to occur starting from a lower dopant concentrations of around $2-3\times10^{18}$ cm³.

Thus, the doping concentration of the linking layer 112 may be understood to have a value (e.g. $2\times10^{18}$-$2\times10^{19}$ cm⁻³) associated with a peak injection efficiency rating, below which the concentration is insufficient, and above which bandgap narrowing becomes increasingly more detrimental. An effective Gummel number for the linking layer 112 may thus be maintained, for example, at a level of $2\times10^{14}$ or higher.

Meanwhile, as referenced above, a preferred doping concentration for the tunnel contact layer 111 is generally above the peak injection efficiency value for the injection layer 112, e.g., at or above $1\times10^{20}$ cm⁻³. Consequently, it may be observed that attempting to combine the regions 111 and 112 may be undesirable in some implementations, e.g., if a high surge current is required for a charge-balanced Schottky rectifier.

Additionally, the high (effective) Gummel number of the injection layer 112 prevents recombination of electrons at the top contact 150. As referenced above, such recombination may mitigate the effects of the tunnel contact layer 111 during short-term, $I_{FM}$ surge current events.

As also described above, the Schottky rectifier 100 is provided with a charge balance between acceptors in the deep p-body 113 and donors in the n-channels 102. This charge balance practically means that within region 109 the total charges of non-compensated acceptors and donors in respective p-type and n-type materials exist at substantially similar numbers. Otherwise, an excessively large difference in charges of said regions may deteriorate reverse blocking performance.

More specifically, in example implementations, an average lateral donor charge Qd of non-compensated donors in the charge-balanced channels 102 may be defined as a total amount of non-compensated donors in the regions 109, divided by the active device area. Acceptor charge Qa may be defined as a total number of non-compensated acceptors within the charge-balanced regions 109 divided by active device area. In some implementations, donor charge Qd and acceptor charge Qa can have a deviation (e.g., a charge imbalance) of approximately $1\times10^{13}$ cm⁻² or lower. In some implementations, a charge imbalance of greater than $1\times10^{13}$ cm⁻² in the rectifier 100 may result in premature avalanche breakdown (e.g., avalanche breakdown below a desired blocking voltage).

Figure 2A:
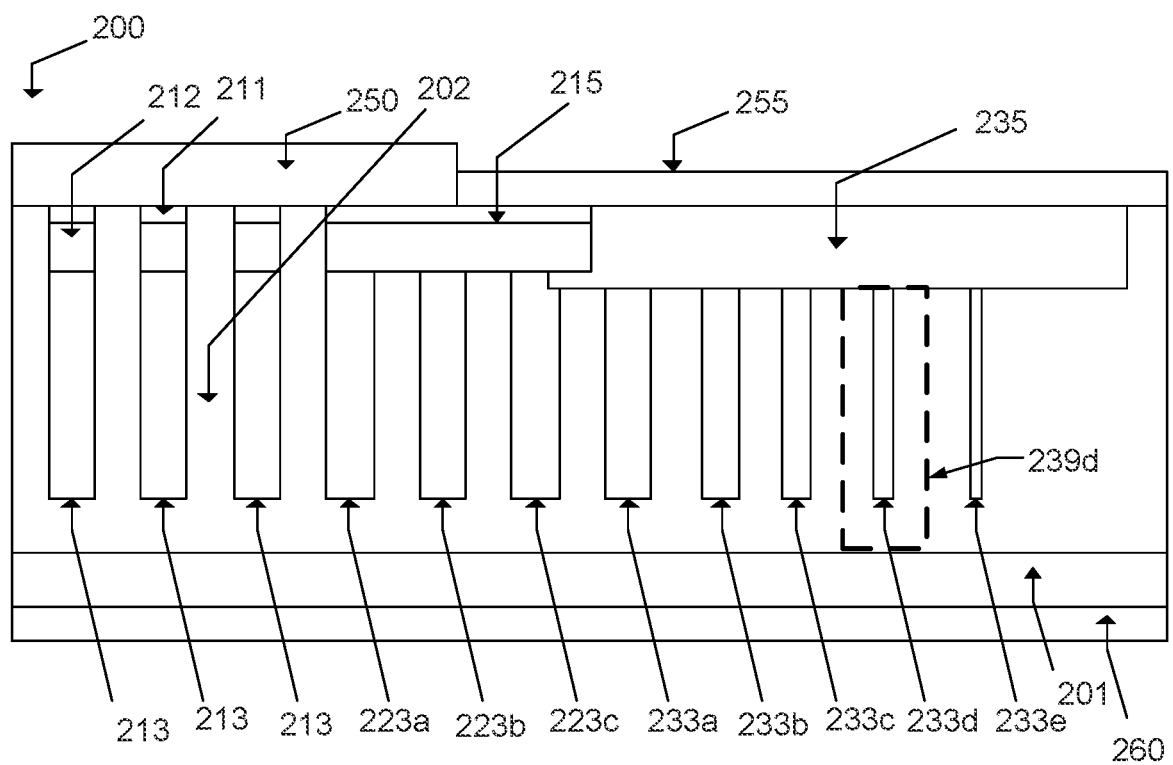
FIG. 2A is a schematic cross-section of an example implementation of the SiC Schottky rectifier of FIG. 1.

FIG. 2A is a schematic cross-section of an example implementation of the SiC Schottky rectifier of FIG. 1. As referenced above, and described with respect to FIGS. 2A-2C, the Schottky rectifier 100 of FIG. 1 may be defined as a unit cell of a larger circuit, e.g., a multi-rectifier circuit, and the unit cells may be sized and spaced relative to one another, and to other circuit elements, in a manner that provides additional surge current protection, among other features and advantages.

More specifically with respect to FIG. 2A, the charge-balanced SiC Schottky rectifier 100 of FIG. 1 may benefit from additional design requirements, which are related to the lateral component of the electric field. For example, the lateral electric field may be undesirably increased in conjunction with an increasing width and/or donor concentration of the n-channels (e.g., n-channel 102 of FIG. 1), which may lead to early breakdown.

In order to avoid such early breakdown, a rectifier device 200 includes an active region 270, which is surrounded by a p-n diode rim 215, and by a termination region 280. The termination region 280 prevents excessive electric field and early breakdown in the diode periphery.

The active region 270 is formed by an array of unit cells, such as those shown in FIG. 1. In FIG. 2, the corresponding cells include a multi-layer p-body that includes a degenerately doped region providing a tunnel contact layer 211, an injection p-body 212 and a deep p-body 213, with an adjacent n-channel 202. The array forming the active region can be one-dimensional (a linear array of p-type and n-type stripes), or a 2-dimensional array having a cellular structure.

The diode rim 215 is formed by a continuous p-body surrounding the unit cell array. The top portion of the p-n diode rim 215 is preferably provided heavy doping, which doping profile may include the top region having the same doping and thickness of regions 212 and 213. An array of deep p-bodies 223a, 223b, 223c is also formed, which may have similar size and doping as that of the deep p-bodies 213. The deep p-bodies 223a, 223b, 223c are distributed over the diode rim with preferably the same period as the period of p-bodies 213 in the active region, in order to maintain charge balance. This design may provide an avalanche breakdown voltage at the rim region that is preferably equal to, or greater than, the avalanche breakdown voltage of the active region. Although three deep p-bodies 223a, 223b, 223c are shown in FIG. 2, example implementations may use a larger number of such deep p-bodies, depending on a desired width of the p-type rim 215.

A metal contact 250 covers the array of unit cells, as well as at least an inner portion of the p-n diode rim 215. An Ohmic contact 260 is provided on the back side of the substrate.

A junction termination (JT) region 280 is provided outside the p-n diode rim 215, so as prevent or mitigate electric field crowding around the device periphery. Different strategies can be applied to achieve this goal. In example implementations, such as FIG. 2A, an array of deep p-bodies 233a-233e surrounding the p-n diode rim 215 may be provided. Although five deep p-bodies 233a through 233e are illustrated in FIG. 2A, a total amount of such p-bodies may be greater. A passivation dielectric may be provided on top of SiC in the junction termination region 280, which dielectric can be silicon dioxide, or silicon nitride, or polyimide, or their combination.

Mean acceptor dose in the deep p-bodies 233a-233e per unit area may be approximately equal to that for the p-n diode rim region 215 for the inner portion of the junction termination region 280. The mean acceptor dose for the junction termination region 280 may be defined in a similar manner as for the active cells, e.g., as the total amount of acceptors in the deep p-bodies 233a-233e divided by the area of the unit cell. More specifically, mean acceptor dose in the vicinity of p-body 233d can be defined by selecting a pseudo unit cell 239d that extends laterally half way towards the mass centers of adjacent p-bodies. The mean donor/acceptor doses in the vicinity of p-body 233d may then be defined as a total amount of relevant dopants contained in 239d, divided by the area of the element 239d. The same definition would apply to elements 233a, 233b, and 233c. The width of the outermost cell of junction termination may be the same number as its nearest neighbor.

The mean acceptor dose may be gradually decreased with increases in distance from the p-n diode rim 215. For example, a width of each deep p-body 233a-233e may be decreased, as shown in FIG. 2A. A characteristic length Ljt may be defined for characterizing a variation of the mean acceptor dose. Accordingly, Ljt may be defined as the distance over which mean acceptor dose decreases to ⅓ of its peak value. The characteristic length Ljt should preferably be at least 3 times the total thickness of the drift region.

In one aspect, the junction termination region 280 may be provided with an interconnecting, continuous, shallow, low-doped acceptor junction termination body 235, interconnecting all the p-bodies 233a-233e and the p-n diode rim 215. This continuous low-doped JT p-body 235 may be provided in order to minimize the voltage drop between adjacent p-bodies during switching transients of the rectifier device.

Acceptor dose in region 235 may be, e.g., between approximately 20% and 70% of the characteristic dose Qchar, where $Qchar = \varepsilon \cdot E_{cr}/q$, in which $E_{cr}$ is the critical field of SiC for a desired breakdown voltage, ε is the absolute permittivity of SiC, and q is the electron charge. The characteristic charge Qchar is the charge required to generate an electric field $E_{cr}$, which $E_{cr}$ is the avalanche breakdown field in SiC at the electrodes of a 1-dimensional rectifier diode. The acceptor dose in the interconnecting body 235 should therefore ensure this region being fully depleted, before the avalanche breakdown voltage is reached. Example values of $E_{cr}$ in 4H SiC are between 2 MV/cm and 3 MV/cm, depending on the diode voltage rating.

In example implementations, the interconnecting junction termination p-body 235 may extend laterally a certain distance beyond the location of the last deep p-body 223c. The extension distance should preferably exceed the drift layer thickness. In this way, the extension p-body 235 will further decrease the crowding of electric field at the deep b-bodies.

In example implementations, the unit cell deep p-body 213 may extend an entire, or almost the entire, depth of the drift region, so that Lpbody is approximately equal to Ldrift. These conditions are amenable to achieving the lowest turn-on voltage of the injection, as shown and described below, with respect to FIG. 3.

Figure 2B:
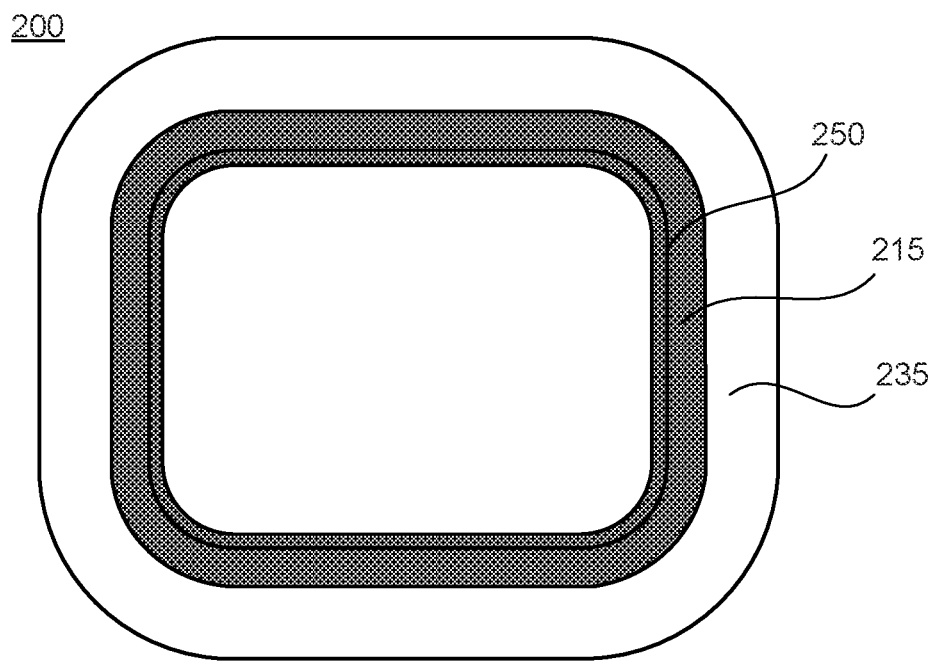
FIG. 2B is a first top view of the example implementation of FIG. 2A.

FIG. 2B is a first top view of the example implementation of FIG. 2A. in FIG. 2B, a top view of the p-n diode rim region 215 is shown. The region 215 illustrates the continuous p-body of the junction termination region 280, while region 235 is a continuous low-doped p-body. The outer edge of the metal contact 250 fully overlaps the active region and at least a portion of the p-n diode rim 935.

Figure 2C:
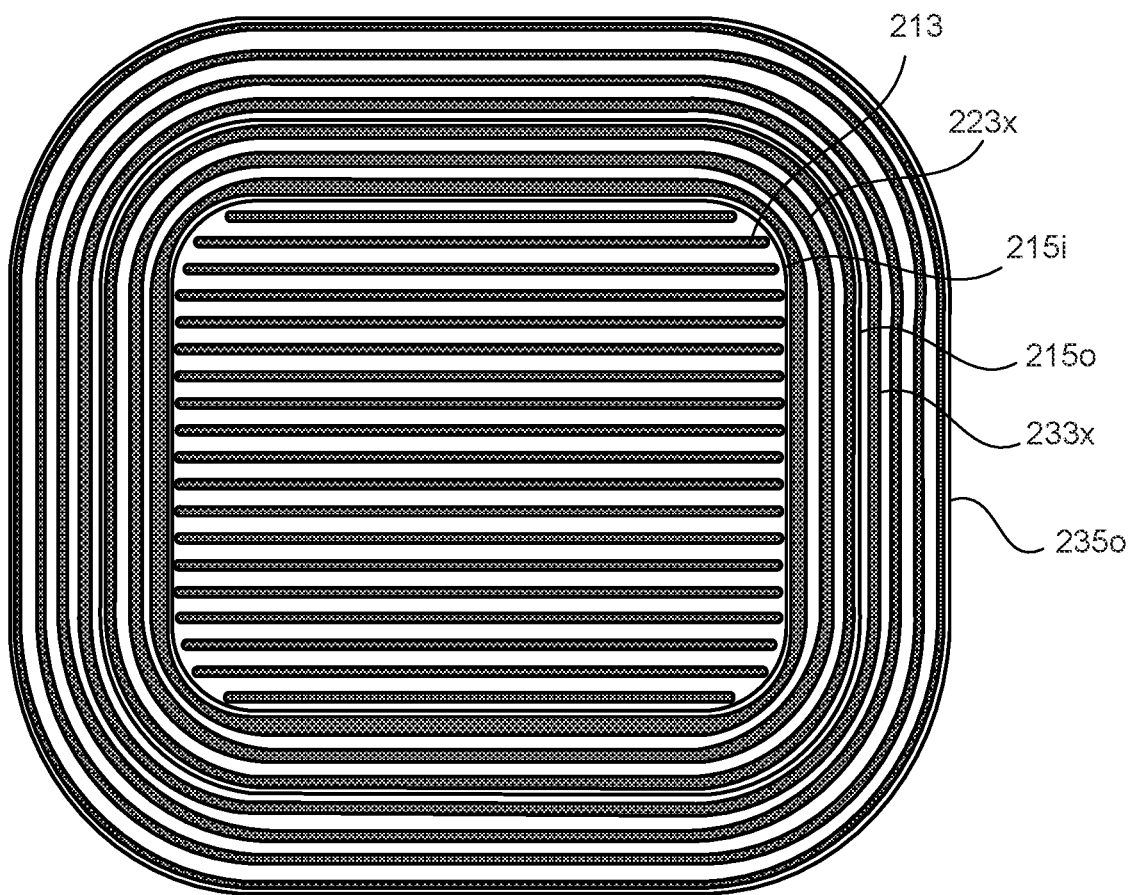
FIG. 2C is a second top view of the example implementation of FIG. 2A.

FIG. 2C is a second top view of the example implementation of FIG. 2A. More specifically, FIG. 2C illustrates a top-view configuration of the deep charge-balanced p-bodies 213 with respect to other device regions, where the footprints of the p-bodies 213 are shown with cross-hatching. In this implementation, charge-balanced p-bodies 213 of the active region form a linear array.

The p-bodies underneath the p-n diode rim 223x may form a concentric linear array. Inner and outer edges of said p-n diode rim are shown by lines 215i and 215o, respectively. A concentric linear array of deep p-bodies 233x is also formed in the junction termination region 280, which outer edge is represented by the line 235o. The mean charge of the deep p-bodies 233x in the termination region 280 is gradually decreased with increasing distance from the p-n diode rim 215, as it was earlier discussed in relation to FIG. 2A.

FIG. 2C shows only one of many possible configurations of the deep p-bodies. For example, the deep p-bodies 213 may form a concentric pattern of the same type as that for the p-bodies 223x and 233x. The p-bodies may also be a 2-dimensional cellular array of p-type islands, which array may represent a 2-dimensional hexagonal lattice.

Figure 3:
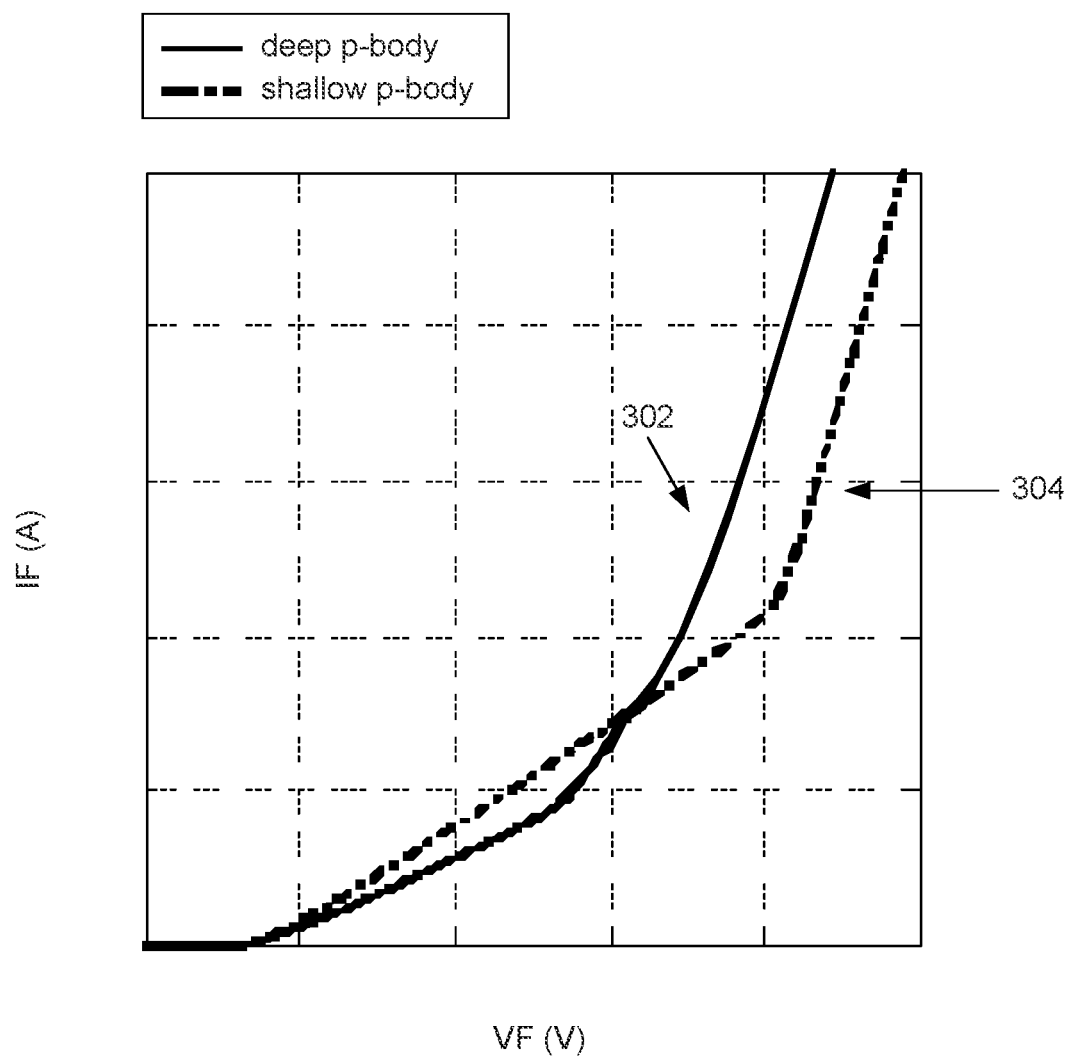
FIG. 3 is a graph illustrating a first current-voltage curve of the Schottky rectifier of FIGS. 1 and 2A-2C.

FIG. 3 is a graph illustrating a first current-voltage curve of the Schottky diode rectifier of FIGS. 1 and 2A-2C. More particularly, FIG. 3 illustrates example results 302 of a TCAD simulation of a 650V Schottky rectifier with a deep p-body doping of $5\times10^{16}$ cm$^{-3}$, where the deep p-body extends to the substrate.

For the sake of comparison, simulation of a reference Schottky rectifier without a deep p-body was also performed, as shown by IV curve 304. As may be observed by the kink or turn in each of the curves 302, 304, both rectifiers go into injection, where the injection onset is seen as the kinks of the I-V curves.

The Schottky rectifier represented by the curve 302 may be observed to go into injection at a considerably lower voltage than the reference rectifier device that does not include the deep p-body 113/213. This is a significant advantage from the viewpoint of device reliability, because such a rectifier has a lower forward drop, and can withstand higher surge current without destruction. A temperature of 250 C was used for the simulation because the surge event results in considerable diode overheating, which temperature is typically above the standard-operation junction temperatures.

Figure 4:
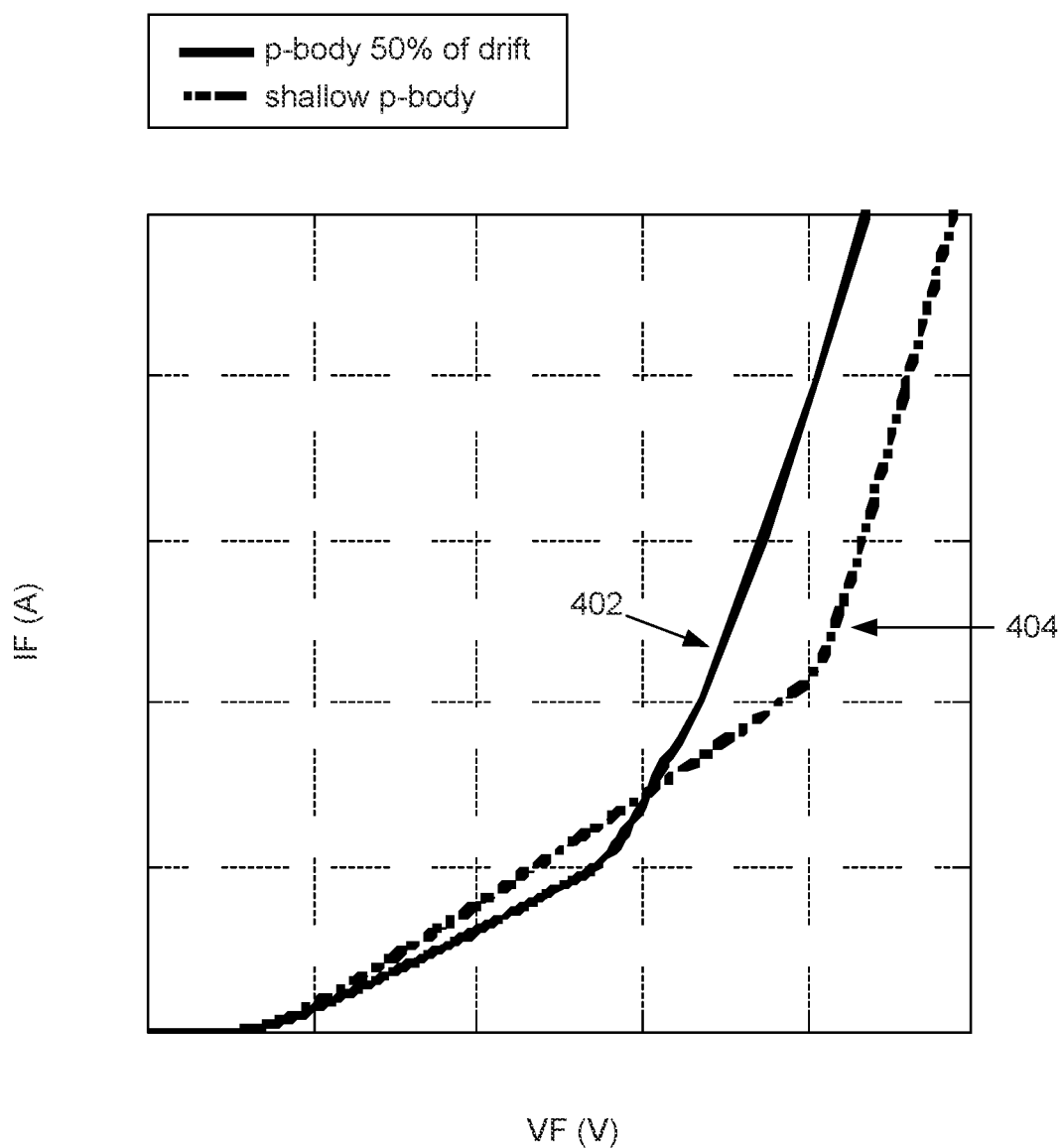
FIG. 4 is a graph illustrating a second current-voltage curve of the Schottky rectifier of FIGS. 1 and 2A-2C.

FIG. 4 is a graph illustrating a second current-voltage curve of the Schottky diode rectifier of FIGS. 1 and 2A-2C. In FIG. 4, forward current IF versus forward voltage VF is shown a curve 402 for a Schottky rectifier of FIG. 1 in which the multi-layer p-body 110 propagates approximately half the way down to the n-type substrate 101. The deep p-body 113 has a net acceptor doping of $8\times10^{16}$. As with FIG. 3, a reference curve 404 is illustrated in FIG. 4 for a Schottky rectifier that does not have the multi-layer p-body.

Figure 5:
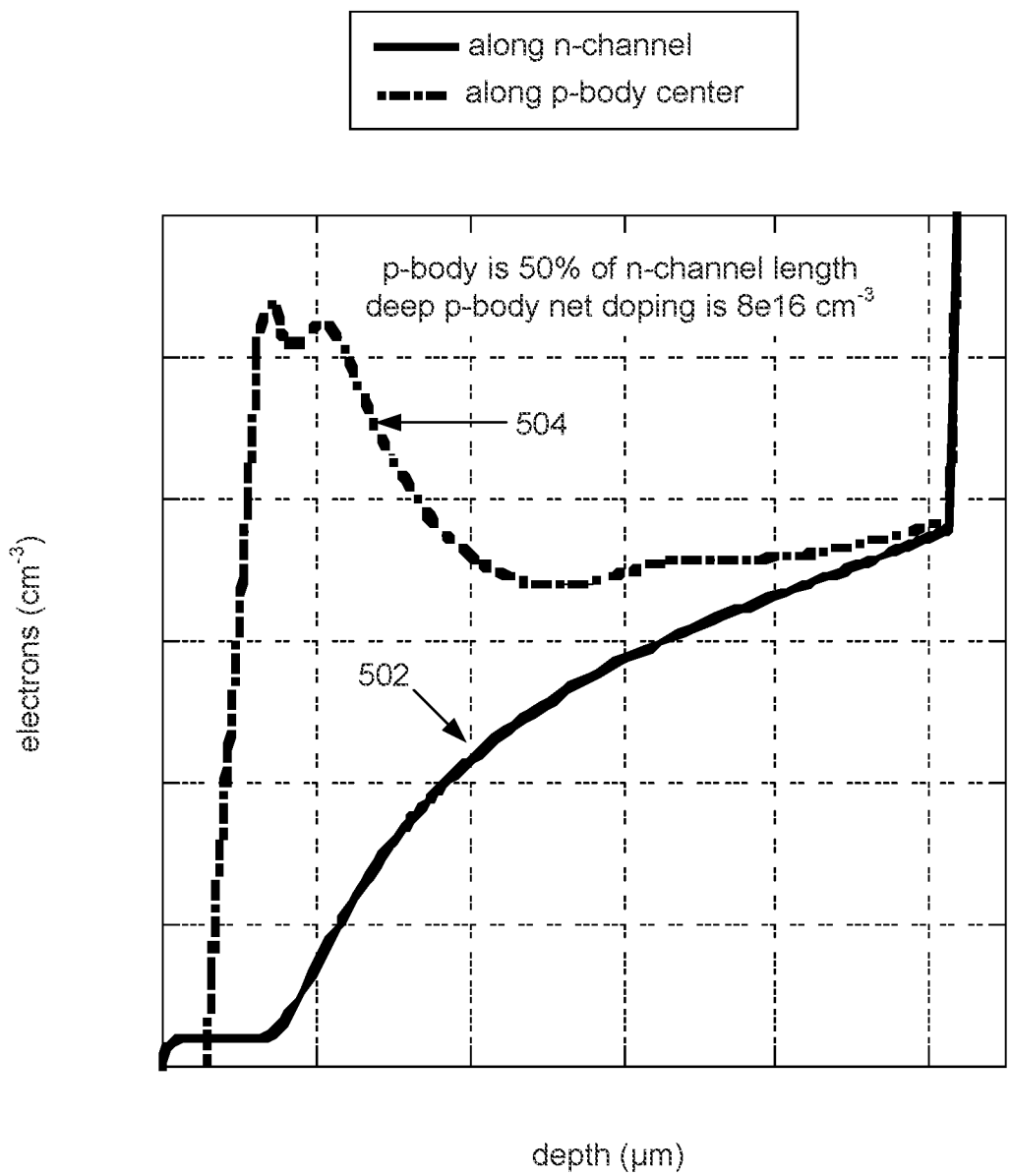
FIG. 5 is a graph illustrating an electron concentration plot along a vertical device cross-section of the Schottky rectifier of FIGS. 1 and 2A-2C.

Comparing the curves 402, 404 plotted in FIG. 4, clear reliability/ruggedness advantages for the Schottky rectifier of FIG. 1 may be observed, as compared to a conventional MPS/JBS device having a shallow p-body. The effect is illustrated and explained in more detail in FIG. 5, which illustrates electron profiles along the center of the n-channel (502) and through the center of the p-body (504). As seen from FIG. 5, strong electron injection occurs both in the n-channel and in the p-body, where electrons are minority carriers.

Figure 6:
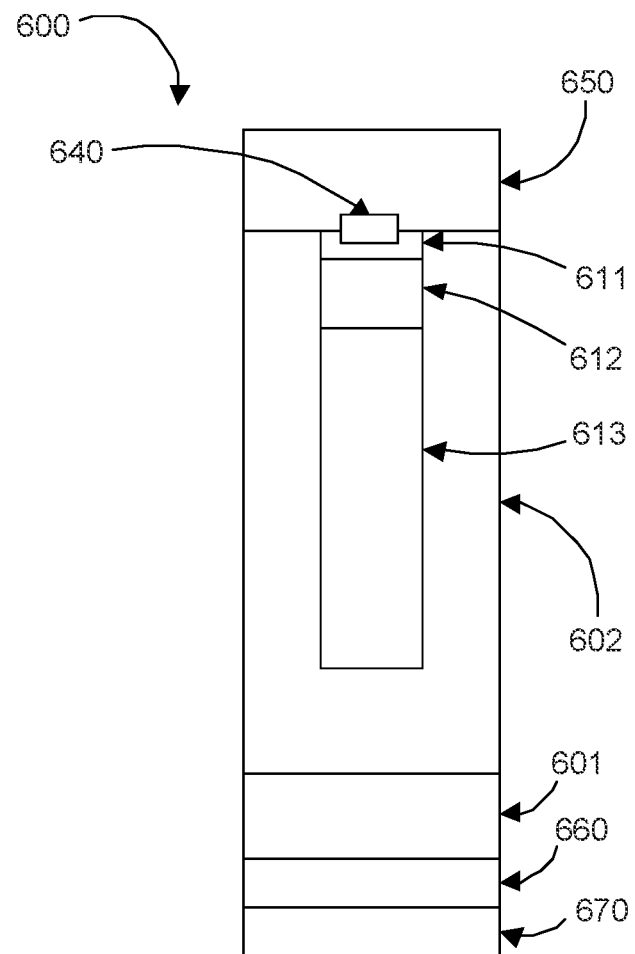
FIG. 6 is a cross-section view of a rectifier unit cell of FIG. 1, with a dedicated Ohmic contact to the multi-layer p-body of FIG. 1.

FIG. 6 is a cross-section view of a rectifier unit cell of FIG. 1, with a dedicated Ohmic contact 640 to the multi-layer p-body 611/612/613. More particularly, the surge-capable rectifier device of FIG. 6 with a deep p-body 611/612/613 is provided with a dedicated Ohmic contact 640 to the degenerately doped subcontact p-type region forming the tunnel contact layer 611.

Meanwhile, an Ohmic contact 610 to the n-type substrate 601 is illustrated as region 660, and a solder metal stack is represented as region 670. The solder metal stack 670 may be, for example, Ti/Ni/Ag, which is commonly used in power devices. The backside contact 610 may be thermally or laser-annealed Ni. In example implementations, the backside contact 610 may be formed by laser-induced silicidation of a Ni/Ti stack. The topside Ohmic contact 640 may be, for example, a layer of nickel silicide, with the silicide being formed by sintering Ni to SiC at a temperature of between approximately 700 C and 950 C.

Typical resistivity values for an NiSi Ohmic contact to SiC are around 0.1 mOhm*cm$^2$, which is generally too high to withstand a high surge current of, e.g., around 20-100 kA/cm$^2$ through the p-bodies 611/612/613. However, due to the tunneling effects referenced earlier, a voltage drop at the interface of 640 to 611 will be a relatively low value of, e.g., a few tenths of Volt, when the levels of degenerate doping in region 611 described above are maintained.

FIGS. 7A-7J illustrate first through tenth operations for forming the Schottky rectifier device(s) of FIGS. 1-2C, according to an example implementation. In FIGS. 7A-7J, the surge-current capable device(s) of FIGS. 1-2C with deep p-bodies is/are formed using sequential cycles of ion implantation and epitaxial regrowth. In some implementations, donors to the n-channel layer may be provided by doping during the epitaxial layer growth, while in other implementations, implantation doping may be used, particularly if relatively higher doping accuracy is desired.

Figure 7A:
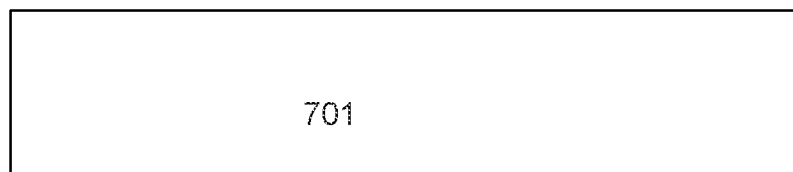
FIGS. 7A-7J illustrate operations for forming one or more of the Schottky rectifier devices of FIGS. 1-2C.
Figure 7B:
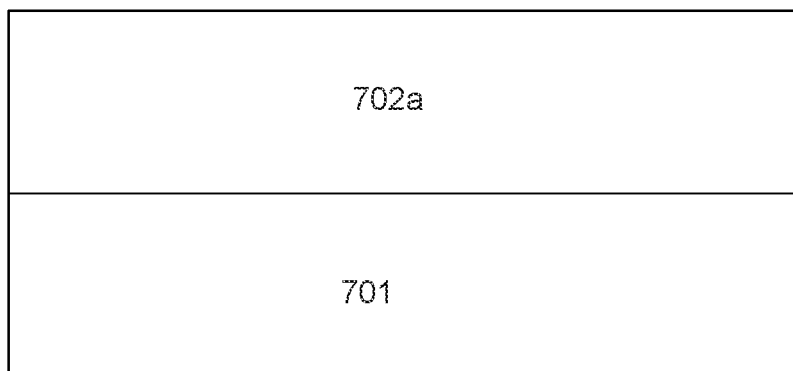
Figure 7C:
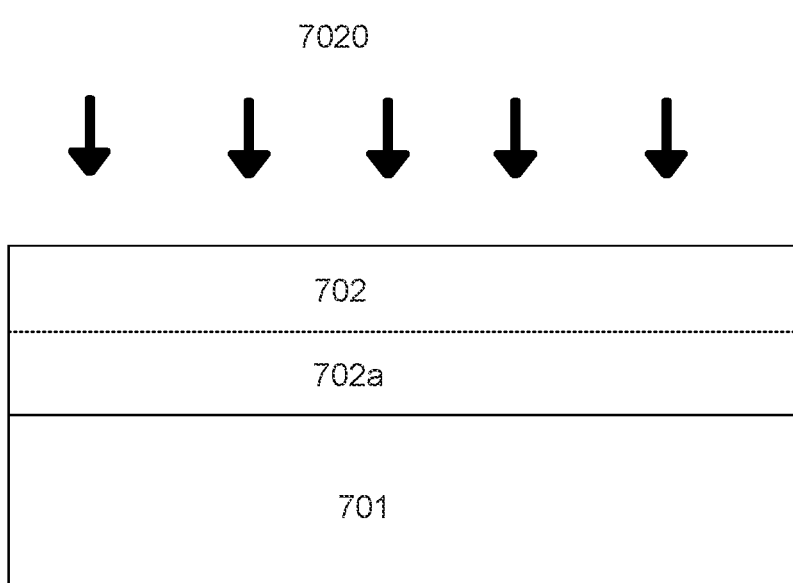

In FIG. 7a, fabrication may begin with a 4H SiC substrate 701. In FIG. 7B, an n-type epitaxial layer 702a of desired doping is provided. The epitaxial layer 702a is blanket-implanted with donor ions 7020 in FIG. 7C, which may be, e.g., nitrogen or phosphorus, or As, or Sb. The donor implant 7020 forms a lower portion of the drift-region channels 702 (e.g., analogous to channels 102 and 202 of FIGS. 1 and 2A).

Figure 7D:
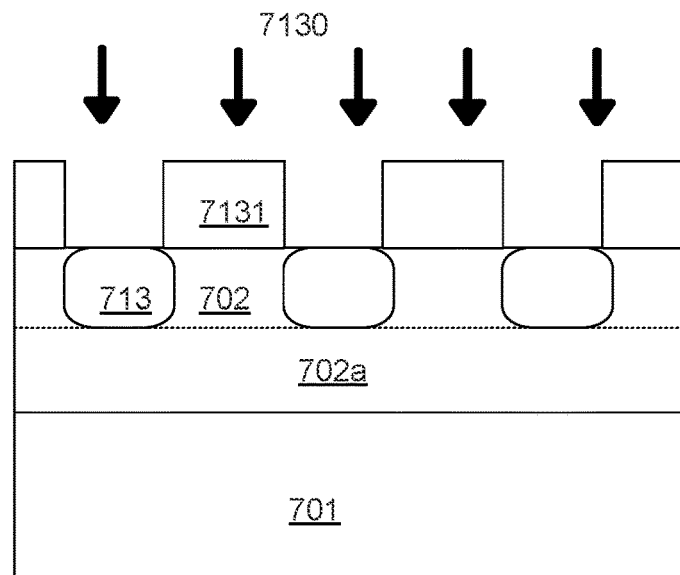

In FIG. 7D, a masking layer 7131 is deposited of photoresist or of another appropriate masking material, such as silicon dioxide, silicon nitride, or tungsten. The masking layer 7131 is patterned, and acceptor ions 7130 are implanted. In example implementations, the acceptor dopant may be Al. However, the deep p-body 113/213/713 may also employ Ga or B, or combinations thereof with Al.

Figure 7E:
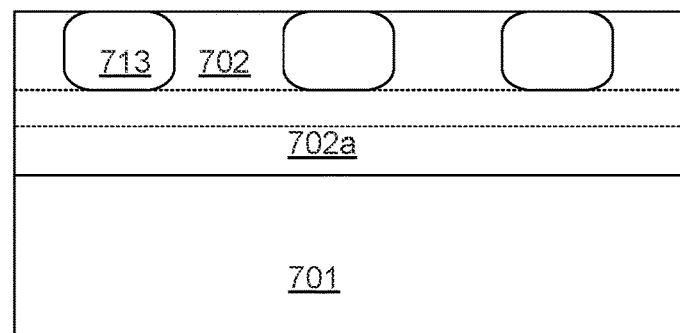
Figure 7F:
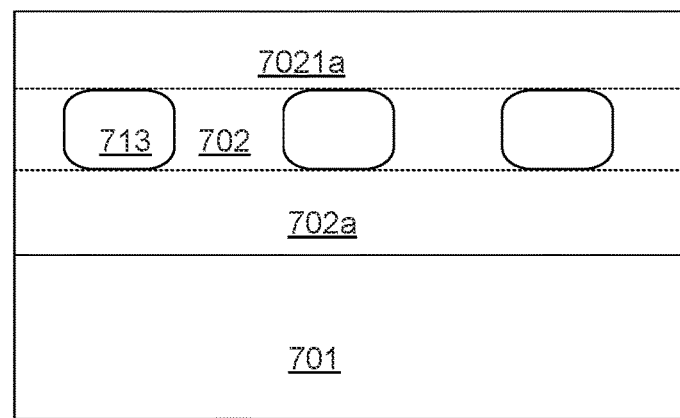
Figure 7G:
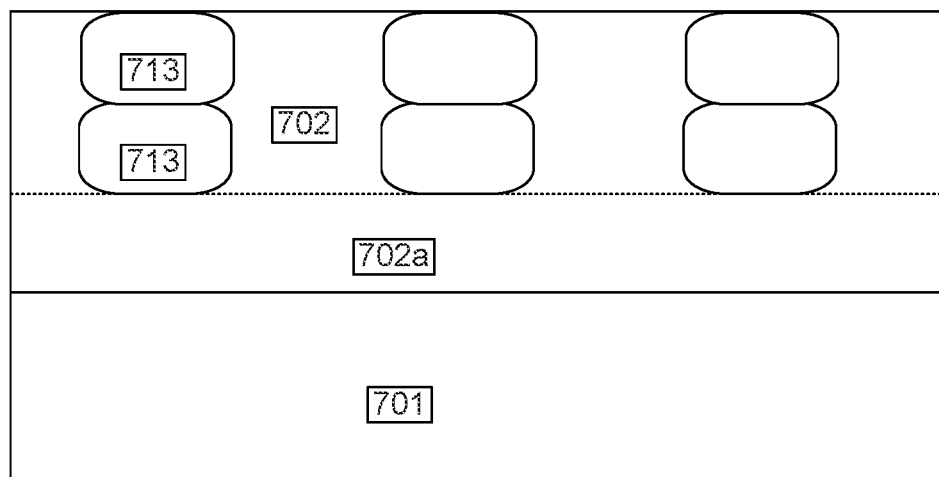
Figure 7H:
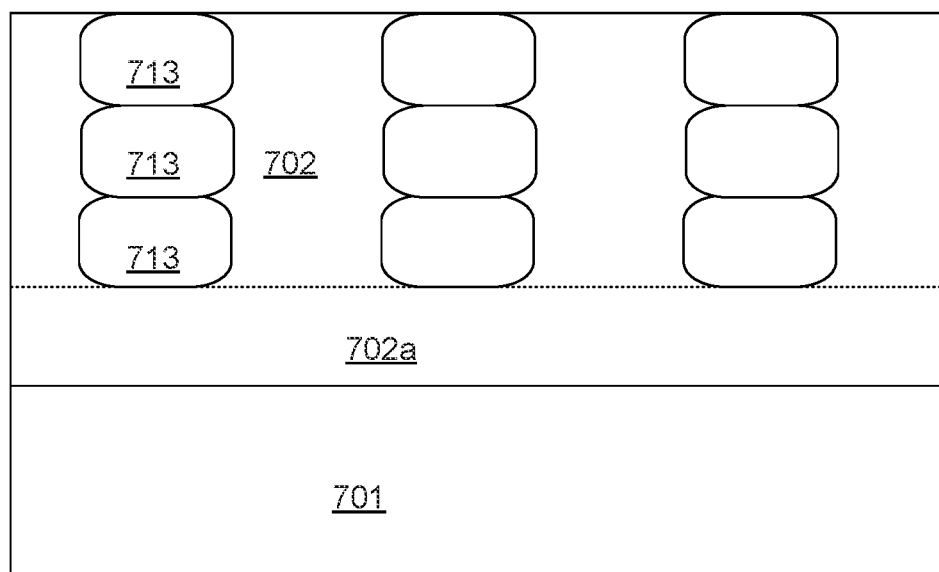
Figure 7I:
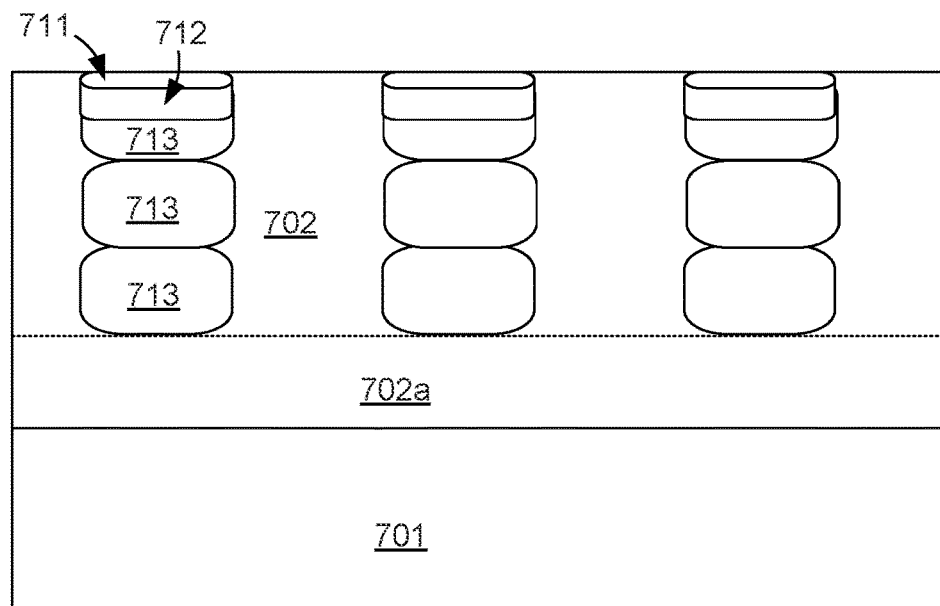
Figure 7J:
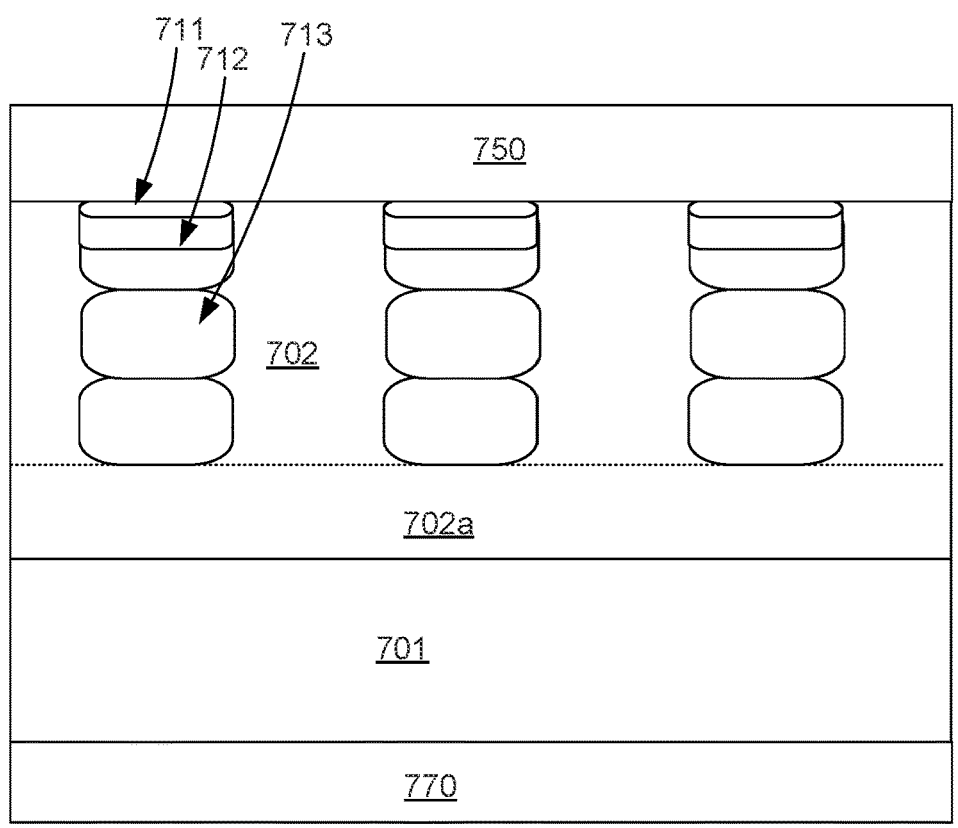

After mask removal in FIG. 7E, the crystal is regrown with an additional epitaxial layer 7021a, as shown in FIG. 7F. The implantation stages 7C through 7F may be reiterated, so as to incrementally increase the thickness of charge-balanced regions 702 and 713, as shown in FIGS. 7G and 7H.

It will be appreciated that deep p-bodies of the diode p-type rim (e.g., regions 223a-223c of FIG. 2A) and of the termination region (regions 233a-233c) may be formed simultaneously with formation of the deep p-body regions of the active-region cell 213 (corresponding to 713 in FIGS. 7D-7H). These regions are omitted in FIGS. 7A-7J, which only show the formation of the active structure. Nonetheless, their fabrication process may use the same or similar stages. Similarly, alignment marks may be formed on the wafer in the areas outside the device locations, so that the marks are also not explicitly shown in FIGS. 7A-7J.

Regions 711 and 712 may be implanted as shown in FIG. 71, with doping levels corresponding to analogous regions 111/211 and 112/212, respectively. Device fabrication may continue with implantation of the junction termination region 235, not shown in FIGS. 7A-7J. Fabrication may further include high-temperature anneal to activate implanted dopants, and formation of metal contacts 750 and 770 on wafer top and bottom, respectively, as shown.

In additional or alternative implementations, the surge-capable Schottky rectifier device(s) described herein, with deep p-body 113/213/713, may be formed using ion implantation with subsequent acceptor dopant anneal. The deep p-body 113/213/713 can be formed by acceptor ion implantation utilizing a high-energy ion implanter, with an acceleration voltage of, e.g., approximately between 1 MV and 5 MV. Ion implant anneal may be performed at a temperature of between approximately 1500 C and 1800 C in argon.

In some implementations, the top surface of the SiC wafer may be provided with a carbon coating prior to the high temperature anneal, in order to avoid SiC surface roughening. The carbon coating may be removed after the high-temperature anneal, using oxygen plasma, by annealing in an oxygen environment, or a combination of both.

In yet further example implementations, channeled room-temperature Al ion implantations of the deep p-body 113/213 may be utilized. For example, channeled implants may be performed along the SiC crystal direction, which is normal to the basal (0001) SiC crystal plane. The surface of epitaxial SiC crystals is typically off-oriented by around a few degrees for the basal (0001) crystal plane, which means the ion beam must be tilted at an equal angle in order to be aligned with the crystal direction.

Al beam alignment to the crystal direction may be performed with high accuracy, e.g., better than within 0.5 degree, or, with an accuracy of within 0.01 to 0.2 degrees. Channeled Al implants penetrate much deeper into SiC compared to so-called random implants, which is a generic name for ion implant off-oriented from low-index crystal direction by more than approximately 1.5 to 2 degrees.

Figure 8:
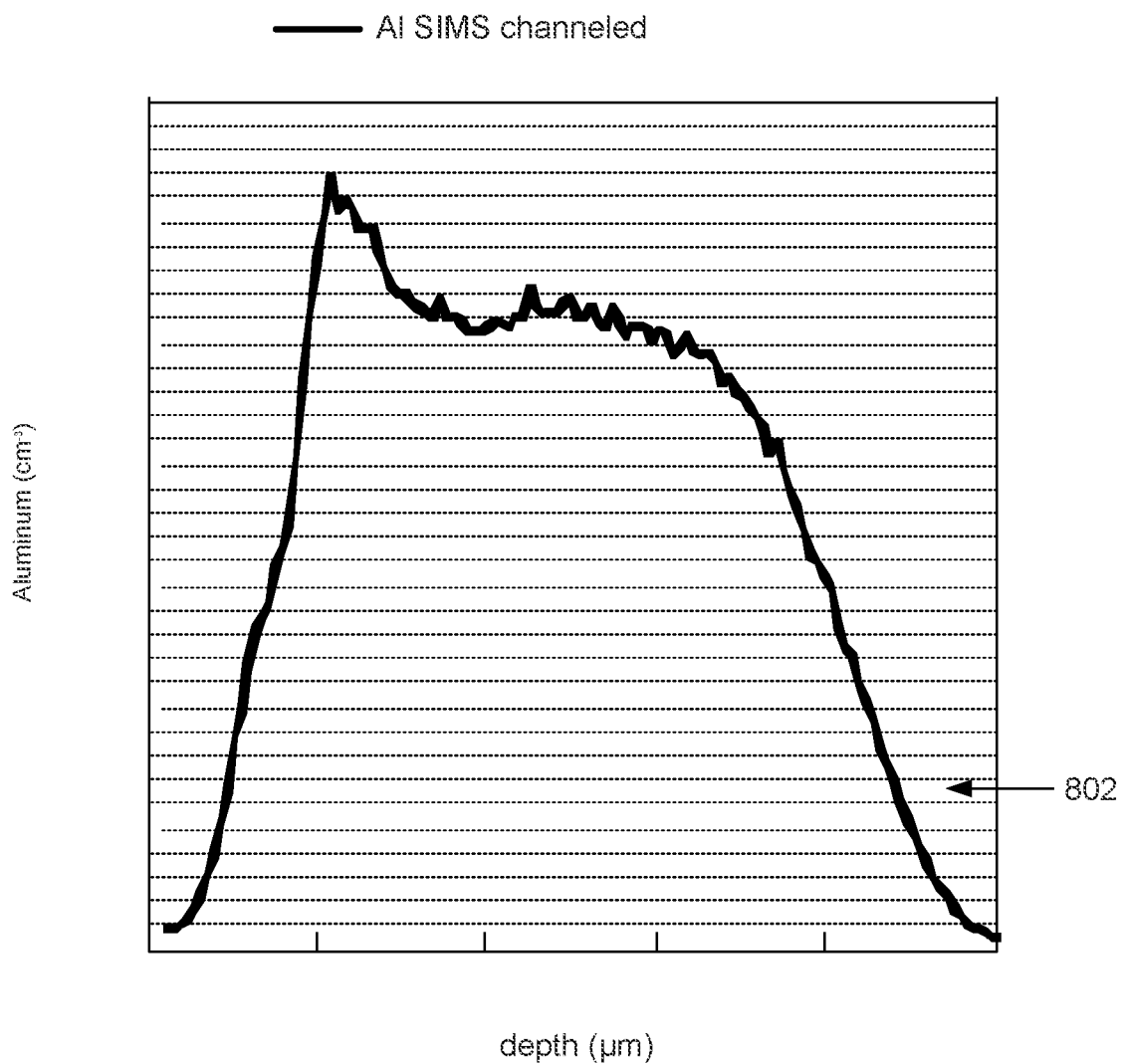
FIG. 8 is a graph illustrating a room-temperature secondary ion mass spectrometry (SIMS) profile for a channeled implant of Al into SiC.

FIG. 8 is a graph illustrating a room-temperature secondary ion mass spectrometry (SIMS) profile 802 for a channeled implant of Al into SiC with a dose of $1\times10^{13}$ cm$^{-3}$, along the 4H SiC crystal direction, with an ion energy of 450 keV. In contrast, achieving the same ion penetration for a random implant may disadvantageously require a few MeV acceleration energy. Rather, the use of deeper channeled implants as described above and illustrated with respect to FIG. 8 may minimize the number of cycles of implantation and regrowth, while at the same time avoiding the requirement for an implanter tool that is capable of Mega-electron-volt ion acceleration. Room-temperature conditions are preferred for channeled implant, because the implant depth decreases with increasing the crystal temperature.

In example implementations, hot implants may used for formation of regions 111 and 112, attempting to implant tunnel contact layer 111/211/711 at room temperature may result in SiC material amorphization. Further, unlike silicon, fully amorphized SiC does not fully recover its structure upon anneal. Therefore amorphization in the course of ion implant may be avoided by, e.g., using an elevated substrate temperature during the implantation, such as between approximately 200 C and 700 C.

In further implementations, the channeled room-temperature implants of lower doped, deep p-bodies 113/213 are performed at the first stage, and the hot high-dose implants of regions 112/212 and 111/211 are performed after the room-temperature channeled implant. Attempting to perform a channeled implant of region 113 after a high-dose implant of region 111 or 112 may result in a heavily-suppressed channeling effect, and therefore in much shallower channel implant than what is otherwise possible for a given implanted ion energy. High-dose implants like those used for regions 112 and 111 generate significant ion damage, even at elevated temperatures. Such damage may disadvantageously suppress ion channeling, e.g., if the channeled implant follows a high-dose implant of region 111 or 112.

Figure 9:
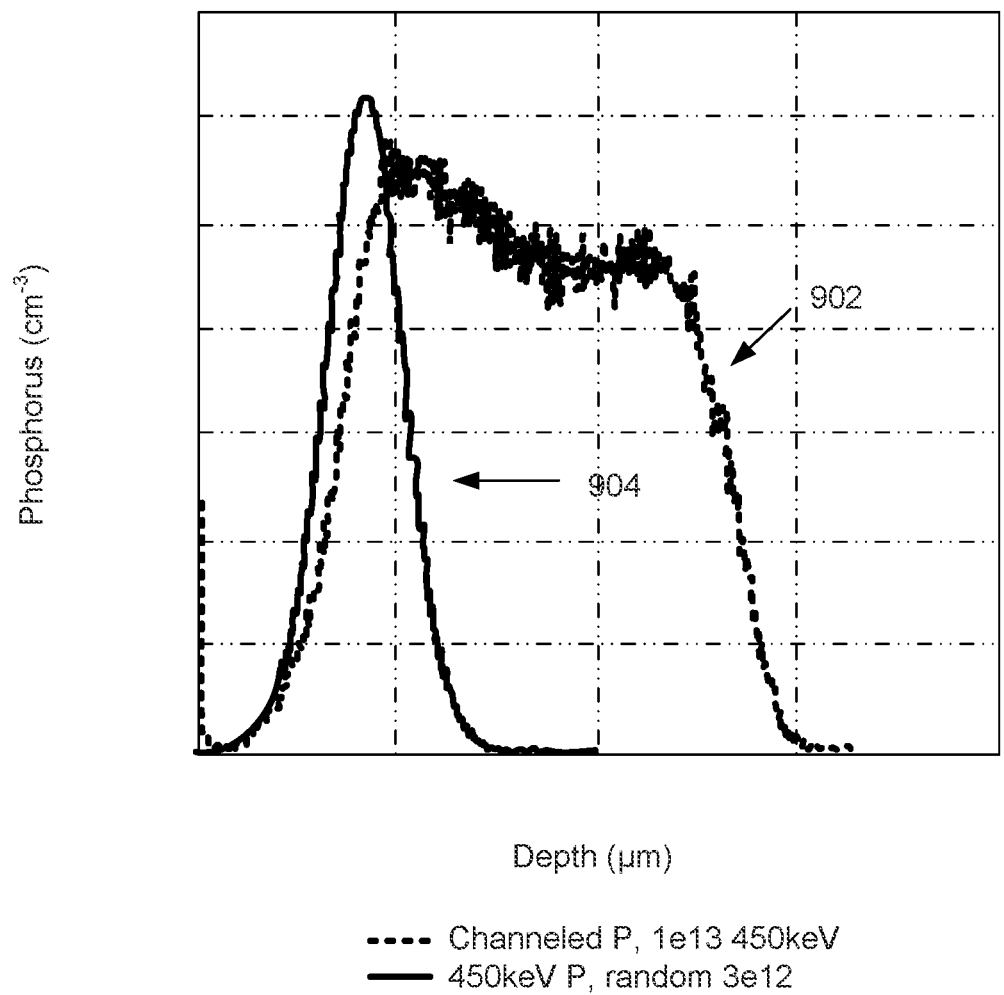
FIG. 9 is a graph showing profiles of channeled phosphorus for donor doping of a drift region of FIGS. 1 and 2A, together with a profile for a random implant.

In additional or alternative implementations, donor doping of the drift region 102/202/702 may be performed using channeled implant of phosphorus, as shown in FIG. 9. For example, a channeled P implant may be established along the crystal direction of 4H SiC, which provides profiles that are more than 3 times deeper than the random implant. Such profiles are generally unexpected, because more common donors, such as nitrogen, do not show such strong channeling in SiC. For example, nitrogen generally increases its ion range by about only 40% upon changing the beam orientation from 4-degree off-axis (referred to as "random") to the channeled condition. SIMS profiles 902 of channeled phosphorus are plotted in FIG. 9, together with a profile 904 for random implant, calculated using available Pearson IV approximation to earlier experimental data.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A Schottky rectifier device, comprising:
a Silicon Carbide (SiC) layer;
a channel region of a first conductivity type formed on the SiC layer;
a metal contact formed on the channel region;
a multi-layer body of a second conductivity type formed within the channel region and extending in a direction of the SiC layer, the multi-layer body including a first layer having a first doping concentration, a second layer adjacent to the first layer and having a second doping concentration less than the first doping concentration, and a third layer adjacent to the second layer and having a third doping concentration less than the second doping concentration, wherein the metal contact extends over an active region of the Schottky rectifier device that includes the channel region and the multi-layer body;

a charge-balanced region that includes the third layer and a portion of the channel region adjacent to the third layer;

a p-n diode rim that surrounds the active region with a continuous body of the second conductivity type and an array of deep rim bodies of the second conductivity type that are parallel to the multi-layer body; and a junction termination region outside of the p-n diode rim that includes a junction termination (JT) body surrounding the p-n diode rim and connected to a plurality of deep JT bodies extending parallel to the multi-layer body and the deep rim bodies.

2. The Schottky rectifier device of claim 1, wherein the second layer has a doping concentration between $1\times10^{18}$ cm$^{-3}$ and $1\times10^{19}$ cm$^{-3}$.

3. The Schottky rectifier device of claim 1, wherein, within the charge-balanced region, charges of non-compensated acceptors and donors in the third layer and the portion of the channel region have a deviation of approximately $1\times10^{13}$ cm$^{-2}$ or lower.

4. The Schottky rectifier device of claim 1, wherein the first layer is degenerately doped and provides a tunnel contact between the metal contact and the second layer.

5. The Schottky rectifier device of claim 1, wherein the multi-layer body extends at least thirty percent of a distance between the metal contact and the SiC layer.

6. The Schottky rectifier device of claim 1, wherein the metal contact overlaps the active region and at least a portion of the p-n diode rim.

7. The Schottky rectifier device of claim 1, wherein a width of each of the plurality of deep JT bodies decreases with distance from the p-n diode rim.

8. The Schottky rectifier device of claim 1, wherein the multi-layer body extends to the SiC layer.

9. A method of making a Schottky rectifier device, the method comprising:

forming a Silicon Carbide (SiC) substrate;

forming an epitaxial layer of a first conductivity type on the SiC substrate;

forming a portion of a charge-balancing body having donors of a second conductivity type;

repeating the forming of the epitaxial layer and the forming the portion of the charge-balancing body until the charge-balancing body reaches a specified thickness;

forming an injection layer on the charge-balancing body, the injection layer having a doping concentration of the second conductivity type that is higher than a doping concentration of the charge-balancing body;

forming a contact layer on the injection layer;

forming a metal contact over the contact layer and the epitaxial layer, wherein the metal contact extends over an active region of the Schottky rectifier device that includes a surrounding epitaxial region of the epitaxial layer and the charge-balancing body;

forming a p-n diode rim that surrounds the active region with a continuous body of the second conductivity type and an array of deep rim bodies of the second conductivity type that are parallel to the charge-balancing body; and forming a junction termination region outside of the p-n diode rim that includes a junction termination (JT) body surrounding the p-n diode rim and connected to a plurality of deep JT bodies extending parallel to the charge-balancing body and the deep rim bodies.

10. The method of claim 9, wherein the contact layer, the injection layer, and the charge-balancing body extend at least thirty percent of a distance from the metal contact to the SiC substrate.

11. The method of claim 9, wherein the contact layer has a doping concentration that is higher than the doping concentration of the injection layer.

12. The method of claim 9, wherein, within a charge-balanced region that includes the charge-balancing body and the surrounding epitaxial region, charges of non-compensated acceptors and donors in the charge-balancing body and the surrounding epitaxial region have a deviation of approximately $1\times10^{13}$ cm$^{-2}$ or lower.

13. A Schottky rectifier device, comprising:

a Silicon Carbide (SiC) layer;

a channel region of a first conductivity type formed on the SiC layer;

a metal contact formed on the channel region;

a multi-layer body of a second conductivity type formed within the channel region and extending in a direction of the SiC layer, the multi-layer body including a tunnel contact layer, an injection layer adjacent to the tunnel contact layer, and a deep layer adjacent to the injection layer, wherein the metal contact extends over an active region of the Schottky rectifier device that includes the channel region and the multi-layer body;

a charge-balanced region that includes the deep layer and a portion of the channel region adjacent to the deep layer;

a p-n diode rim that surrounds the active region with a continuous body of the second conductivity type and an array of deep rim bodies of the second conductivity type that are parallel to the multi-layer body; and a junction termination region outside of the p-n diode rim that includes a junction termination (JT) body surrounding the p-n diode rim and connected to a plurality of deep JT bodies extending parallel to the multi-layer body and the deep rim bodies.

14. The Schottky rectifier device of claim 13, wherein, within the charge-balanced region, charges of non-compensated acceptors and donors in the deep layer and the portion of the channel region have a deviation of approximately $1\times10^{13}$ cm$^{-2}$ or lower, and further wherein the multi-layer body extends at least thirty percent of a distance from the tunnel contact layer to the SiC layer.

15. The Schottky rectifier device of claim 14, comprising a silicide Ohmic contact between the tunnel contact layer and the metal contact.

16. The Schottky rectifier device of claim 13, wherein the multi-layer body extends an entire distance from the metal contact to the SiC layer.

* * * * *